(12) United States Patent
Hikmet et al.

(10) Patent No.: US 11,927,342 B2
(45) Date of Patent: Mar. 12, 2024

(54) HIGH-INTENSITY LIGHT SOURCE WITH HIGH CRI

(71) Applicant: SIGNIFY HOLDING B.V., Eindhoven (NL)

(72) Inventors: Rifat Ata Mustafa Hikmet, Eindhoven (NL); Ties Van Bommel, Horst (NL); Martinus Petrus Joseph Peeters, Weert (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/010,515

(22) PCT Filed: Jun. 14, 2021

(86) PCT No.: PCT/EP2021/065963
§ 371 (c)(1),
(2) Date: Dec. 15, 2022

(87) PCT Pub. No.: WO2021/254959
PCT Pub. Date: Dec. 23, 2021

(65) Prior Publication Data
US 2023/0235873 A1     Jul. 27, 2023

(30) Foreign Application Priority Data
Jun. 16, 2020 (EP) ..................... 20180126

(51) Int. Cl.
*F21V 9/38*     (2018.01)
*C09K 11/77*     (2006.01)
*F21Y 115/30*    (2016.01)

(52) U.S. Cl.
CPC ............ *F21V 9/38* (2018.02); *C09K 11/7774* (2013.01); *F21Y 2115/30* (2016.08)

(58) Field of Classification Search
CPC .. F21K 9/64; F21S 41/16; F21S 41/76; F21V 13/08; F21V 9/30; F21V 9/38;
(Continued)

(56) References Cited

U.S. PATENT DOCUMENTS

2003/0035447 A1   2/2003  Scheps
2010/0303468 A1  12/2010  Mastro et al.
(Continued)

FOREIGN PATENT DOCUMENTS

EP      3149108 A2    4/2017
JP    2019503558 A    2/2019
(Continued)

OTHER PUBLICATIONS

S. Sattayaporn et al., "Crystal Growth, Spectroscopy and Laser Performances of PR3+:SR0.7LA0.3MG0.3AL 11.7O19 (PR:ASL)", Optics Express, 1278, vol. 26, No. 2, Jan. 2018 (12 Pages).

*Primary Examiner* — Zheng Song

(57) ABSTRACT

The invention provides a light generating device (1000), wherein: (I) the light generating device (1000) comprises: (a) a first light source (110) configured to generate first light source light (111) having a first light source light spectral power distribution, wherein the first light source (110) comprises a first laser light source (10) configured to generate first laser light source light (11); (b) a first luminescent material (210) configured to convert at least part of the first light source light (111) into first luminescent material light (211) having a first luminescent material spectral power distribution having an emission at one or more wavelengths selected from the wavelength range of 590-780 nm, wherein the first luminescent material (210) is configured in an optical resonator (230); (II) the first light source (110) and the first luminescent material (210) are configured to generate first luminescent material laser light (1211) having a first luminescent material laser light spectral power distri-
(Continued)

bution comprising at least part of the first luminescent material light (211); (III) the first light source light spectral power distribution and the first luminescent material laser light spectral power distribution mutually differ; and (IV) the light generating device (1000) is configured to generate in one or more operational modes white device light (1001) comprising the first luminescent material laser light (1211).

15 Claims, 9 Drawing Sheets

(58) Field of Classification Search
CPC ............. F21Y 2115/30; H01S 3/09415; H01S 3/1613; H01S 3/1638; H01S 3/2391; H01S 5/0087; H01S 5/4093; C09K 11/7774

See application file for complete search history.

(56) References Cited

U.S. PATENT DOCUMENTS

| | | |
|---|---|---|
| 2017/0051884 A1 | 2/2017 | Raring et al. |
| 2018/0056027 A1* | 3/2018 | Peeters ............... H05B 45/20 |
| 2018/0316160 A1 | 11/2018 | Raring et al. |
| 2018/0372280 A1* | 12/2018 | Van Bommel ....... G02B 6/0068 |
| 2020/0035873 A1 | 1/2020 | Estrada et al. |
| 2022/0275925 A1* | 9/2022 | Van Bommel ............ F21V 9/30 |
| 2023/0304653 A1* | 9/2023 | Petluri ................... H05B 45/24 |
| | | 315/297 |

FOREIGN PATENT DOCUMENTS

| | | |
|---|---|---|
| JP | 2019533880 A | 11/2019 |
| JP | 2020090424 A | 6/2020 |
| WO | 2018016047 A1 | 1/2018 |

* cited by examiner

HIGH-INTENSITY LIGHT SOURCE WITH HIGH CRI

CROSS-REFERENCE TO PRIOR APPLICATIONS

This application is the U.S. National Phase application under 35 U.S.C. §371 of International Application No. PCT/EP2021/065963, filed on Jun. 14, 2021, which claims the benefit of European Patent Application No. 20180126.3, filed on Jun. 16, 2020. These applications are hereby incorporated by reference herein.

FIELD OF THE INVENTION

The invention relates to a light generating device and to a luminaire or lamp comprising such light generating device.

BACKGROUND OF THE INVENTION

White light sources using a laser diode and phosphor are known in the art. US2018/0316160, for instance, describes a device and method for an integrated white colored electromagnetic radiation source using a combination of laser diode excitation sources based on gallium and nitrogen containing materials and light emitting source based on phosphor materials. A violet, blue, or other wavelength laser diode source based on gallium and nitrogen materials may be closely integrated with phosphor materials, such as yellow phosphors, to form a compact, high-brightness, and highly-efficient, white light source. The phosphor material is provided with a plurality of scattering centers scribed on an excitation surface or inside bulk of a plate to scatter electromagnetic radiation of a laser beam from the excitation source incident on the excitation surface to enhance generation and quality of an emitted light from the phosphor material for outputting a white light emission either in reflection mode or transmission mode.

SUMMARY OF THE INVENTION

While white LED sources can give intensity 300 lm/mm$^2$ whereas static phosphor converted laser white sources can give 20.000 lm/mm$^2$. Ce doped garnets (YAG, LuAG) may be the most suitable luminescent convertors which can be used for pumping with a blue laser light as garnet matrix has the highest chemical stability and at low Ce concentrations (below 0.5%) temperature quenching occurs above 200° C. Furthermore, emission from Ce has a very fast decay time so that optical saturation can be avoided. In previous applications such as automotive the corelated color temperatures above 5000 K at low CRI have been demonstrated. When for example light sources with an intensity higher than 1 GCd/m$^2$ with CRI>90 and at lower CCT<3000K need to be produced, there is a need for red light source or red emitting lasers. However, some Eu$^{2+}$ based red emitting phosphors at such high intensities either, quench, degrade or show saturation. Red lasers can also show different aging behavior than blue laser and as a result the color point of the light source change during its lifetime which is not desired.

Hence, it is an aspect of the invention to provide an alternative light generating device, which preferably further at least partly obviates one or more of above-described drawbacks. The present invention may have as object to overcome or ameliorate at least one of the disadvantages of the prior art, or to provide a useful alternative.

Amongst others, using rare earth doped crystals which can give down converting laser emission in the red region when stimulated by a blue laser are herein suggested. Part of the blue laser light may then be used to pump e.g. cerium doped YAG phosphor. Combining spontaneous emission light from YAG, stimulated emission from red emitting crystal and blue emitting laser, white light with CRI higher than 90 at a CCT below 3500 K, or even below 3000K, essentially on the black body locus BBL, can be obtained. Other embodiments, however, are also possible. In a first aspect, the invention provides a light generating device ("lighting device" or "device"), especially configured to generate device light ("light generating device light"). Especially, the light generating device comprises a first light source and a first luminescent material. As will be explained further below, optionally the light generating device may also include further light sources, especially a second light source. Especially, the light generating device comprises (a) a first light source configured to generate first light source light having a first light source light spectral power distribution. In embodiments, the first light source comprises a first laser light source configured to generate first laser light source light. Further, especially the light generating device comprises (b) a first luminescent material configured to convert at least part of the first light source light into first luminescent material light having a first luminescent material spectral power distribution. In embodiments, the first luminescent material light has an emission at one or more wavelengths selected from the wavelength range of 590-780 nm. Especially, the first luminescent material light has an emission having a dominant wavelength selected from the wavelength range of 590-780 nm, more especially from the wavelength range of 618-630 nm. In specific embodiments, the first light source and the first luminescent material are configured to generate first luminescent material laser light having a first luminescent material laser light spectral power distribution comprising at least part of the first luminescent material light. Especially, the first light source light spectral power distribution and the first luminescent material laser light spectral power distribution mutually differ. In specific embodiments, the light generating device may be configured to generate in one or more operational modes (of the light generating device) white device light comprising the first luminescent material laser light. Further, especially the first luminescent material may be configured in an optical resonator. Hence, especially the invention provides in embodiments a light generating device, wherein the light generating device comprises: (a) a first light source configured to generate first light source light having a first light source light spectral power distribution, wherein the first light source comprises a first laser light source configured to generate first laser light source light; (b) a first luminescent material configured to convert at least part of the first light source light into first luminescent material light having a first luminescent material spectral power distribution having an emission at one or more wavelengths selected from the wavelength range of 590-780 nm, wherein especially the first luminescent material is configured in an optical resonator; and wherein (i) the first light source and the first luminescent material are configured to generate first luminescent material laser light having a first luminescent material laser light spectral power distribution comprising at least part of the first luminescent material light; (ii) the first light source light spectral power distribution and the first luminescent material laser light spectral power distribution mutually differ; (iii) the light generating device may be configured to generate in one or more operational modes (of the light generating device) white device light comprising the first luminescent material laser light. Yet further, in embodiments—as will be further elucidated below—the light generating device may (c) optionally comprise a second light source configured to generate second light source light having a second light source light spectral power distribution. Especially, in embodiments the second light source comprises a second laser light source configured to generate second laser light source light. Hence, in yet further specific embodiments the invention provides a light generating device, wherein the light generating device comprises: (a) a first light source configured to generate first light source light having a first light source light spectral power distribution, wherein the first light source comprises a first laser light source configured to generate first laser light source light; (b) a first luminescent material configured to convert part of the first light source light into first luminescent material light having a first luminescent material spectral power distribution having an emission at one or more wavelengths selected from the wavelength range of 590-780 nm; and (c) optionally a second light source configured to generate second light source light having a second light source light spectral power distribution, wherein the second light source comprises a second laser light source configured to generate second laser light source light; wherein (i) the first light source and the first luminescent material are configured to generate first luminescent material laser light having a first luminescent material laser light spectral power distribution comprising at least part of the first luminescent material light; (ii) the first light source light spectral power distribution, the second light source light spectral power distribution, and the first luminescent material laser light spectral power distribution mutually differ; (iii) the light generating device may be configured to generate in one or more operational modes (of the light generating device) white device light comprising the first luminescent material laser light (and one or more of (i) the first light source light and (ii) the second light source light).

With such device it is possible to provide with a high intensity white light with a relatively low correlated color temperature (CCT), such as below about 3000 K, and with a relatively high color rendering index, such as at least 85, like even about 90. Further, with such device it is even possible to use a single laser light source, or a single type of laser light sources, which may further reduce possible color changes of the device light over time. Hence, amongst others the invention provides a high intensity light generating device, essentially without differential aging related color point shift in time, using rare earth doped crystals for stimulated emission in red, for obtaining high CRI and R9 at e.g. color temperatures below about 3000 K.

As indicated above, the light generating device comprises (i) a first light source configured to generate first light source light. The first light source light may have wavelengths in one or more of the UV, blue, green, and yellow. Especially, the first light source light has one or more wavelengths in the blue. Even more especially, the first light source light has a dominant wavelength in the blue. Hence, in embodiments, the light generating device comprises (i) a first light source configured to generate blue first light source light. Hence, the first light source light may especially have a color point in the blue.

Especially, the first light source comprises a first laser light source. The first laser light source is especially configured to generate first laser light source light. The first light source light may in embodiments essentially consist of the first laser light source light. Hence, in embodiments the first light source is a first laser light source. In embodiments, the term "first light source" may also refer to a plurality of the same first light sources. In embodiments, a bank of first laser light sources may be applied. Alternatively or additionally, the term "first light source" may also refer to a plurality of different first light sources. In embodiments, the term "first laser light source" may also refer to a plurality of the same first laser light sources. Alternatively or additionally, the term "first laser light source" may also refer to a plurality of different first laser light sources.

Yet further, the light generating device comprises a first luminescent material configured to convert part of the first light source light into first luminescent material light having a first luminescent material spectral power distribution. Especially, this first luminescent material light has one or more (emission) wavelengths in the orange and/or red. Even more especially, the first luminescent material light may have an emission at one or more wavelengths selected from the wavelength range of 590-780 nm. Even more especially, such as in view of CRI, the first luminescent material light may have an emission at one or more wavelengths selected from the wavelength range of 605-780 nm, even more especially 605-645 nm. Yet even more especially, the first luminescent material light may (at least) have an emission at one or more wavelengths selected from the wavelength range of 605-650 nm, such as selected from the range of 618-645 nm, even more especially in the range of 618-632 nm. In specific embodiments, the first luminescent material light may have an emission with a dominant wavelength selected from the wavelength range of 605-650 nm, such as selected from the range of 618-645 nm, even more especially in the range of 618-632 nm. It appears that with such dominant wavelength, in a relatively efficient way a high CRI may be provided.

The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion. In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex} < \lambda_{em}$), though in specific embodiments the luminescent material may comprise down-converter luminescent material, i.e. radiation of a larger wavelength is converted into radiation with a smaller wavelength ($\lambda_{ex} > \lambda_{em}$). In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials.

The first luminescent material is used to generate laser light having a laser emission in the orange and or red, especially at least in the red. Hence, especially the first luminescent material may be used to generate laser light having a laser emission at one or more wavelengths selected from the wavelength range of 610-650 nm, such as 618-650 nm, like selected from the range of 618-645 nm. Hence, in embodiments the first light source and the first luminescent material, and optional first optics, are configured to generate first luminescent material laser light having a peak wavelength within the wavelength range of 618-650 nm, such as in the range of 618-632 nm.

Optionally, (first) optics may be applied to filter out undesired (emission) wavelengths. However, this may also lead to a reduction in efficiency.

Hence, in embodiments the first light source and the first luminescent material are configured to generate first luminescent material laser light having a first luminescent material laser light spectral power distribution comprising at least part of the first luminescent material light. By pumping the first luminescent material with a laser, and e.g. configuring the luminescent material between two (wavelength dependent) mirrors, the first luminescent material may be brought into a lasing mode. Lasing techniques including solid state luminescent materials are known in the art, such as e.g. based on $Cr^{3+}$, $Ti^{3+}$, etc.. Especially, in embodiments the luminescent material comprises a luminescent ceramic body or a luminescent crystal.

For getting red laser light, especially some trivalent lanthanides may be applied. Hence, in specific embodiments the first luminescent material may comprise an inorganic material doped with a rare earth ion, especially a trivalent rare earth ion. Especially, the (trivalent) rare earth ion is selected to convert one or more of blue light and UV radiation into visible light, especially red light.

Especially trivalent praseodymium seems to be useful in this context. Hence, in embodiments the first luminescent material comprises $Pr^{3+}$. For instance, one of the $^3P$ states (and/or $^1I_6$ states) may be pumped, like e.g. the $^3P_2$ state, which may lead to a red emission to the $^3F^2$ state. Other transitions, however, may also be possible.

In specific embodiments, the first luminescent material may comprises a $Pr^{3+}$ doped aluminate. For instance, in embodiments the first luminescent material may comprise strontium lanthanum magnesium aluminate. Especially, in embodiments the first luminescent material may comprise $Sr_{1-x-y}La_xPr_yMg_{x+y}Al_{12-x-y}O_{19}$, wherein $0\leq x\leq 1$, $0\leq y\leq 1$, and $0<x+y\leq 1$. Especially, $0.0001\leq y\leq 0.1$, such as $0.001\leq y\leq 0.03$, like about $0.001\leq y\leq 0.02$. In embodiments, $0<x<1$. Even more especially, in embodiments the first luminescent material may comprise $Sr_{0.7}La_{0.3}Mg_{0.3}Al_{11.7}O_{19}:Pr^{3+}$, with about 0.05-5, such as 0.05-3 at. % $Pr^{3+}$, such as about 0.1-2 at. %, such as e.g. described in by S. Sattayaporn et al., Optics Express, vol. 26 (2), 22 Jan. 2018, p. 1278-1289. Alternatively, embodiments the first luminescent material may comprise YLF ($LiYF_4:Pr^{3+}$) or YAP ($YAlO_3$ (or yttrium aluminum perovskite)), or YAG ($Y_3Al_5O_{12}:Pr^{3+}$), etc., such as described by M. Malinowski et al., in Journal de Physique IV, Colloque C4, supplement au Journal de Physique III, volume 4, April 1994, page C4-541-544 (https://hal.archives-ouvertes.fr/file/index/docid/252582/filename/ajp-jp4199404C4130.pdf). However, other materials than mentioned above may also be used.

Using a laser as pump source, the radiation of the laser, such as a blue emitting laser diode (LD), may be collimated by a collimator which commonly is a high precision aspheric lens with a short focal length and a high numerical aperture. The resulting beam may be parallel in one axis showing a more or less rectangular to elliptical intensity cross section.

The focusing lens may be used to focus the blue pump laser radiation into the Pr-doped host lattice, such as YLF, YAP, or one of the above-mentioned aluminates. The Pr-doped host lattice may be coated only with a broadband anti reflection coating on both sides, so called ARB coating. The wavelength range for lowest reflection covers the entire emission range of the Pr-doped material including the pump radiation, such as in embodiments at about 445 nm (YLF). The optical cavity may in embodiments be formed by a flat mirror on one side and a curved mirror at the other side (M2) with the Pr-doped host lattice in between. In principle the laser mirror could also be directly coated onto a side of the Pr-doped host lattice. However, this may reduce the flexibility for the operation at different wavelength since for each particular wavelength an extra laser crystal would be required.

Here, the "Pr-doped host lattice" refers to a ceramic or a crystal of the Pr-doped material. Especially, crystals may be applied.

A person skilled in the art knows how to build a solid state laser. Amongst others laser cavities may be applied. These may also be indicated as "optical cavity" or "resonator cavity". In the resonator cavity the laser light is amplified in a gain medium. Laser resonators may typically be formed by using highly reflective dielectric mirrors or a monolithic crystal that utilizes total internal reflection to keep light from escaping. One may for instance use a plane parallel resonator, comprising two flat mirrors separated by a distance equal to an integral multiple of one half of the lasing wavelength. One may also use a concentric resonator, comprising two spherical mirrors with the same radius of curvature and coincident centers of curvature. One may also use a confocal resonator comprising two spherical mirrors with the same radius of curvature and coincident focal points. Yet further one may use a ring resonator wherein a ring of more than two reflectors is applied, where the total closed loop path of the reflected light is equal to an integral multiple of one half of the lasing wavelength. Hence, solid-state bulk lasers are usually built with several dielectric mirrors (laser mirrors), which may be plain or curved. The luminescent ceramic body luminescent crystal are applied as the gain medium. In some embodiments, a dielectric mirror coating is placed on the gain medium itself. One of the mirrors, usually an end mirror, is the partially transmissive output coupler.

Hence, in embodiments the first luminescent material is configured in an optical resonator (or "laser cavity"). Especially, the optical resonator may be defined by two (wavelength dependent) mirrors (and the luminescent body). However, also a ring resonator may be applied (see also above).

As indicated above, e.g. Pr-doped material may be pumped with blue light. Hence, in embodiments the first light source is configured to generate blue first light source light. Especially, in embodiments the first light source is configured to generate blue laser light.

As further elucidated below, it may be desirable to generate in one or more operational modes white light. The red (luminescent material based) laser light alone cannot make white light. Hence, one or more other sources of light may be applied. For white light, in general blue light is needed in combination with one or more of yellow light and orange light, or blue light in combination with red light and one or more of yellow light and green light.

In embodiments, essentially all the first light source light may be used to irradiate the first luminescent material, but not all first light source light may be converted by the first luminescent material into first luminescent material laser light. At least part of the first light source light that is not converted may be used to provide at least part of one of the afore-mentioned light components. At least part of the first luminescent material laser light may be used to provide at least part of another one of the afore-mentioned light components. For instance, the first light source light may be blue light and the first luminescent material laser light may comprise one or more or orange light and red light.

Alternatively or additionally, part of the first light source may be used to generate the first luminescent material laser light, and part of the first light source light may bypass the first luminescent material. At least part of the first light source light that is not converted may be used to provide at least part of one of the afore-mentioned light components. At least part of the first luminescent material laser light may be used to provide at least part of another one of the afore-mentioned light components. For instance, the first light source light may be blue light and the first luminescent material laser light may comprise one or more or orange light and red light.

When part of light source light should bypass a luminescent material, second optics may be applied, e.g. be a beam splitter. The beam splitter may be cubic beam splitter based on two triangulars. The beam splitter may be a polarizing beam splitter. The beam splitter may be a half-silvered mirror. Beam splitters are known in the art. For example, a depolarization element may be used or a combination of lasers with different polarizations may be used. The light sources may also emit different wavelength ranges e.g. different types of blue. Hence, in embodiments a dichroic beam splitter may be used.

The part of the first light source light that may bypass the first luminescent material may be generated in several ways. In embodiments, this part may be branched off from the first light source. Hence, in such embodiments the same first light source(s) generate the first light source light that is branched in first light source light for irradiating the first luminescent material and in first light source light that bypasses the first luminescent materials. In other embodiments, two (or more) sets of first light sources may be used, with one set of one or more first light sources that are used for irradiating the first luminescent material and another set of one or more first light sources that are used to generate first light source light that bypasses the first luminescent materials. The latter embodiment allows an individual controlling of the different sets (and thus better spectral properties control).

In the afore-mentioned embodiments, the first light source light may be blue light and the first luminescent material laser light may comprise one or more or orange light and red light. For white light, also one or more of yellow light and green light. Hence, a further source of light may be necessary in embodiments. The one or more of yellow light and green light may be generated in different ways.

In embodiments, the one or more of yellow light and green light may at least partly be provided by luminescent material light. Hence, to this end the light generating device may comprise a further luminescent material, herein also indicated as second luminescent material. The second luminescent material may be configured to generate second luminescent material light comprising one or more of yellow light and green light.

Optionally, the one or more of yellow light and green light may (also) be generated as second luminescent material laser light. This may be done according to similar principles as described in relation to the first luminescent material laser light. Note that the term "second luminescent material" may also refer to a plurality of different second luminescent materials (see also above). The second luminescent material may be pumped via the first light source or via a second light source (or in specific embodiments via both).

When using the first light source (to pump the second luminescent material), unconverted first light source light and/or first light source light that has bypassed the first luminescent material may be used to generate at least part of the second luminescent material light. Hence, note that with a single laser, or a single type of lasers, all light required for white light may be generated. As indicated above, the one or more of yellow light and green light may be generated as second luminescent material laser light, using first light source light as pump light.

Alternatively or additionally, a second light source may be used to pump the second luminescent material. Such second light source especially is configured to generate second light source light having another spectral power distribution than the first light source light. Especially, such second light source may comprise a second laser light source. As indicated above, the one or more of yellow light and green light may be generated as second luminescent material laser light, using second light source light as pump light.

Alternatively or additionally, a second light source, especially a second solid state light source, may also be used as such. Hence, at least part of the light source light escaping from e.g. a LED die may be the yellow light or the green light may be generated as second laser light. Therefore, in embodiments a second light source, especially a laser light source, may be applied to generate the one or more of yellow light and green light. Hence, in such embodiments the second light source light may be second laser light source light comprising one or more of yellow light and green light. The second light source may be a diode laser.

Therefore, especially the second light source comprises a second laser light source. The second laser light source is especially configured to generate second laser light source light. The second light source light may in embodiments essentially consist of the second laser light source light. Hence, in embodiments the second light source is a second laser light source. Hence, in embodiments the second light source is a second laser light source. In embodiments, the term "second light source" may also refer to a plurality of the same second light sources. In embodiments, a bank of second laser light sources may be applied. Alternatively or additionally, the term "second light source" may also refer to a plurality of different second light sources. In embodiments, the term "second laser light source" may also refer to a plurality of the same second laser light sources. Alternatively or additionally, the term "second laser light source" may also refer to a plurality of different second laser light sources.

Here below, some embodiments are discussed.

The first light source and the second light source may be individually chosen and are thus not necessarily of the same type (notwithstanding the fact that the first light source and second light source are by definition different as the light source light generated by the first light source differs in spectral power distribution from the second light source light).

Herein, the terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light.

The term UV radiation may in specific embodiments refer to near UV radiation (NUV). Therefore, herein also the term "(N)UV" is applied, to refer to in general UV, and in specific embodiments to NUV. The term IR radiation may in specific embodiments refer to near IR radiation (NIR). Therefore, herein also the term "(N)IR" is applied, to refer to in general IR, and in specific embodiments to NIR.

Herein, the term "visible light" especially relates to light having a wavelength selected from the range of 380-780 nm.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). The term "laser light source" especially refers to a laser. Such laser may especially be configured to generate laser light source light having one or more wavelengths in the UV, visible, or infrared, especially having a wavelength selected from the range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser.

Hence, in embodiments the light source comprises a laser light source. In embodiments, the terms "laser" or "solid state laser" may refer to one or more of cerium doped lithium strontium (or calcium) aluminum fluoride (Ce: LiSAF, Ce:LiCAF), chromium doped chrysoberyl (alexandrite) laser, chromium ZnSe (Cr:ZnSe) laser, divalent samarium doped calcium fluoride (Sm:CaF$_2$) laser, Er:YAG laser, erbium doped and erbium—ytterbium codoped glass lasers, F-Center laser, holmium YAG (Ho:YAG) laser, Nd:YAG laser, NdCrYAG laser, neodymium doped yttrium calcium oxoborate Nd:YCa$_4$O(BO$_3$)$_3$ or Nd:YCOB, neodymium doped yttrium orthovanadate (Nd:YVO$_4$) laser, neodymium glass (Nd:glass) laser, neodymium YLF (Nd: YLF) solid-state laser, promethium 147 doped phosphate glass (147Pm$^{3+}$:glass) solid-state laser, ruby laser (Al$_2$O$_3$: Cr$^{3+}$), thulium YAG (Tm:YAG) laser, titanium sapphire (Ti:sapphire; Al$_2$O$_3$:Ti$^{3+}$) laser, trivalent uranium doped calcium fluoride (U:CaF$_2$) solid-state laser, Ytterbium doped glass laser (rod, plate/chip, and fiber), Ytterbium YAG (Yb:YAG) laser, Yb$_2$O$_3$ (glass or ceramics) laser, etc. In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank. The laser bank may in embodiments comprise heat sinking and/or optics e.g. a lens to collimate the laser light. For instance, a bank may comprise at least 10 laser light sources.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources.

In specific embodiments, the light source light is thus especially collimated light source light. In yet further embodiments, the light source light is especially (collimated) laser light source light.

The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape,) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

In embodiments, the beam of light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Downstream of a laser, one or more optical elements may be configured to provide the collimated beam. For instance, in embodiments one or more lenses, especially at least two lenses, may be configured.

Especially, the first light source and the optional second light source is (are) diode lasers.

As indicated above, the first light source may especially be configured to generate blue first light source light. Even more especially, the first light source may especially be configured to generate first (laser) light source light that can be absorbed by a trivalent lanthanide ion, such as especially $Pr^{3+}$, leading to one or more (laser) transitions in the orange and/or red.

Hence, in embodiments the first luminescent material may be configured to absorb part of the (blue) first light source light, and the light generating device may be configured to generate in one or more operational modes (of the light generating device) white device light comprising the first light source light, the first luminescent material laser light, and optionally the second light source light. Pathways in which (white) light device light may be generated are discussed above (and further also below).

For instance, in embodiments the light generating device may comprise one or more first light sources configured to generate the first light source light, wherein: (a) the one or more first light sources, the first luminescent material and optional second optics are configured to generate part of the first light source light bypassing the first luminescent material, and (b) in one or more operational modes of the light generating device the light generating device may be configured to generate white device light comprising the first light source light that bypasses the first luminescent material, the first luminescent material laser light, and optionally the second light source light. When more than one first light source is applied, it is possible to devote one or more first light sources to irradiate the first luminescent material and one or more other first light sources to provide (blue) first light source light (that bypasses the first luminescent material, and may be used as such (as blue component) and/or may e.g. be used to irradiate a second luminescent material (see also below)). When a single first light source is applied, however, also when more than a single first light source is applied, the second optics may be used to divert part of the first light source light for bypassing the first luminescent material (and may be used as such (as blue component) and/or may e.g. be used to irradiate a second luminescent material (see also below)).

In yet further embodiments, the light generating device may further comprise a second light source configured to generate second light source light having a second light source light spectral power distribution, wherein the second light source comprises a second laser light source configured to generate second laser light source light. Especially, the first light source light spectral power distribution, the second light source light spectral power distribution, and the first luminescent material laser light spectral power distribution mutually differ. Further, especially the second light source may in embodiments be configured to generate second light source light having the second light source light spectral power distribution with one or more wavelengths in the green and yellow wavelength range. Hence, the light generating device may be configured to generate in one or more operational modes (of the light generating device) white device light comprising the first luminescent material laser light (and one or more of (i) the first light source light and (ii) the second light source light).

However, in (other) embodiments the light generating device may (also) further comprise a second luminescent material configured to convert at least part of one or more of (a) the first laser light source light and (b) the optional second laser light source light, to provide second luminescent material light. Especially, in embodiments the light generating device may be configured to generate in one or more operational modes (of the light generating device) white device light comprising the first luminescent material light and the second luminescent material light. Pathways in which (white) light device light may be generated are discussed above (and further also below).

In specific embodiments, (i) the first laser light source and the first luminescent material are configured to generate first luminescent material laser light, (ii) the first laser light source and the second luminescent material are configured to generate second luminescent material light, and (iii) the light generating device may be configured to generate in one or more operational modes (of the light generating device) white device light comprising the first laser light source light, the first luminescent material laser light, and the second luminescent material light. As indicated above, the first laser light source light may e.g. be blue light, the first luminescent material laser light may red light, and the second luminescent material light may be one or more of yellow and green light.

In yet other embodiments, the light generating device may comprise a plurality of first laser light sources configured to generate blue laser light, wherein: (i) a first set of one of more first laser light sources are configured to generate blue first laser light that bypasses the first luminescent material and the second luminescent material, (ii) a second set of one of more first laser light sources are configured to generate blue first laser light that irradiates the first luminescent material but bypasses the second luminescent material, (iii) a third set of one of more first laser light sources are configured to generate blue first laser light that bypasses the first luminescent material but irradiates the second luminescent material, and in specific embodiments (iv) the light generating device may further comprise a control system configured to control the plurality of first laser light sources. Hence, in specific embodiments it may even be possible with a single type of light sources to generate, in combination with luminescent materials, the white device light, wherein at least part of the device light comprises laser light.

As indicated above, in embodiments the light generating device may comprise a second luminescent material. Especially suitable (second) luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art. In specific embodiments the luminescent material comprises $(Y_{x1-x2-x3}A_{x2}Ce_{x3})_3(Al_{y1-y2}B_{y2})_5O_{12}$, wherein x1+x2+x3=1, wherein x3>0, wherein 0<x2+x3≤0.2, wherein y1+y2=1, wherein 0≤y2≤0.2, wherein A comprises one or more elements selected from the group consisting of lanthanides and scandium, and wherein B comprises one or more elements selected from the group consisting of Ga and In, wherein in specific embodiments at maximum 10% of Al—O may be replaced by Si—N. As indicated above, in specific embodiments x3 is selected from the range of 0.001-0.04. Especially such luminescent materials may have a suitable spectral distribution (see however below), have a relatively high efficiency, have a relatively high thermal stability, and allow a high CRI (in combination with the first light source light and the second light source light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein 0<x2+x3≤0.1, and wherein 0≤y2≤0.1. Further, in specific embodiments, at maximum 1% of Al—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein x1+x3=1, and wherein 0<x3≤0.2, such as 0.001-0.1. In specific embodiments, the light generating device may only include luminescent materials selected from the type of cerium comprising garnets. In even further specific embodiments, the light generating device includes a single type of luminescent materials, such as $(Y_{x1-x2-x3}A_{x2}Ce_{x3})_3(Al_{y1-y2}B_{y2})_5O_{12}$.

The second luminescent material light may e.g. have a dominant wavelength in the orange-red wavelength range. Examples of such second luminescent material may e.g. be $M_2S_5N_8$:Eu$^{2+}$ and/or MAlSiN$_3$:Eu$^{2+}$ and/or Ca$_2$AlSi$_3$O$_2$N$_5$:Eu$^{2+}$, etc., wherein M comprises one or more of Ba, Sr and Ca, especially in embodiments at least Sr.

The first luminescent material may in embodiments be provided by or comprised by a single crystal or a ceramic luminescent body. Hence, in embodiments the luminescent body may comprise the first luminescent material.

Instead of the term "luminescent body", and similar terms, also the term "light transmissive body", and similar terms, may be applied, as the luminescent body is also transmissive for the first luminescent material light.

As indicated above, the light generating system especially comprises a luminescent body. The luminescent body may comprise (N) side faces (over at least part of the length L), wherein N≥3. Hence, especially the luminescent body has a cross-sectional shape that is square (N=4), rectangular (N=4), hexagonal (n=6), or octagonal (n=8), especially rectangular. Would the luminescent body have a circular cross-section, N may be considered co.

The (elongated) body includes a first end or first face, in general configured perpendicular to one or more of the (n) side faces and a second end or second face, which may be configured perpendicular to one or more of the side faces, and thus parallel to the first face, but which also may be configured under an angle unequal to 90° and unequal to 180°. Hence, in embodiments in specific embodiments the radiation exit window has an angle unequal to 0° and unequal to 180° with one or more of the one or more side faces, especially all of the side faces. Note that the angle α may differ per for different side faces. For instance, a slanted radiation exit window of a bar shaped elongated body may have an angle of α1 with a first side face, an angle α2=180°−α1 with a second side face, and angles of 90° with the two other side faces.

The (elongated) luminescent body may thus in embodiments include (n) side faces, which comprise a first side face, comprising a radiation input face, and a second side face configured parallel to the first side face, wherein the side faces define a height (H). The first and the second side face are configured parallel with luminescent body material in between, thereby defining the width of the luminescent body. The radiation input face is at least part of the first face which may be configured to receive the light source light. The (elongated) luminescent body further comprises a radiation exit window bridging at least part of the height (H) between the first side face and the second side face. Especially, the radiation exit window is comprised by the second face. Further embodiments are also elucidated below. As indicated above, in embodiments the radiation exit window and the radiation input face have an angle (a) unequal to 0° and unequal to 180°. Yet further, as also indicated above in embodiments the radiation exit window has an angle unequal to 0° and unequal to 180° with one or more of the one or more side faces.

The light transmissive body has light guiding or wave guiding properties. Hence, the light transmissive body is herein also indicated as waveguide or light guide. As the light transmissive body is used as light concentrator, the light transmissive body is herein also indicated as light concentrator. The light transmissive body will in general have (some) transmission of one or more of (N)UV, visible and (N)IR radiation, such as in embodiments at least visible light, in a direction perpendicular to the length of the light transmissive body. Without the activator (dopant) such as trivalent cerium, the internal transmission in the visible might be close to 100%.

The transmission of the light transmissive body for one or more luminescence wavelengths may be at least 80%/cm, such as at least 90%/cm, even more especially at least 95%/cm, such as at least 98%/cm, such as at least 99%/cm. This implies that e.g. a 1 $cm^3$ cubic shaped piece of light transmissive body, under perpendicular irradiation of radiation having a selected luminescence wavelength (such as a wavelength corresponding to an emission maximum of the luminescence of the luminescent material of the light transmissive body), will have a transmission of at least 95%. Hence, the luminescent body is herein also indicated "light transmissive body", as this body is light transmissive for the luminescent material light.

Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein, disregard Fresnel losses.

In embodiments, an anti-reflection coating may be applied to the luminescent body, such as to suppress Fresnel reflection losses (during the light incoupling process).

In addition to a high transmission for the wavelength(s) of interest, also the scattering for the wavelength(s) may especially be low. Hence, the mean free path for the wavelength of interest only taking into account scattering effects (thus not taking into account possible absorption (which should be low anyhow in view of the high transmission), may be at least 0.5 times the length of the body, such as at least the length of the body, like at least twice the length of the body. For instance, in embodiments the mean free path only taking into account scattering effects may be at least 5 mm, such as at least 10 mm. The wavelength of interest may especially be the wavelength at maximum emission of the luminescence of the luminescent material. The term "mean free path" is especially the average distance a ray will travel before experiencing a scattering event that will change its propagation direction.

The transmission can be determined by providing light at a specific wavelength with a first intensity to the light transmissive body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The light transmissive body may have any shape, such as beam (or bar) like or rod like, however especially beam like (cuboid like). The light transmissive body, such as the luminescent concentrator, might be hollow, like a tube, or might be filled with another material, like a tube filled with water or a tube filled with another solid light transmissive medium. The invention is not limited to specific embodiments of shapes, neither is the invention limited to embodiments with a single exit window or outcoupling face. Below, some specific embodiments are described in more detail. Would the light transmissive body have a circular cross-section, then the width and height may be equal (and may be defined as diameter). Especially, however, the light transmissive body has a cuboid like shape, such as a bar like shape, and is further configured to provide a single exit window.

In a specific embodiment, the light transmissive body may especially have an aspect ratio larger than 1, i.e. the length is larger than the width. In general, the light transmissive body is a rod, or bar (beam), or a rectangular plate, though the light transmissive body does not necessarily have a square, rectangular or round cross-section. In general, the light source is configured to irradiate one (or more) of the longer faces (side edge), herein indicated as radiation input face, and radiation escapes from a face at a front (front edge), herein indicated as radiation exit window. The light source(s) may provide radiation to one or more side faces, and optionally an end face. Hence, there may be more than one radiation input face. The radiation exit window may especially have an angle unequal to 0° and unequal to 180° with the radiation input face, such as angle(s) of 90°. Further, in specific embodiments the radiation exit window has an angle unequal to 0° and unequal to 180° with one or more of the one or more side faces, such as angle(s) of 90°.

Especially, in embodiments the solid state light source, or other light source, is not in (direct) physical contact with the light transmissive body.

Especially, in embodiments the light transmissive body comprises a radiation input face, configured in a light receiving relationship with the first light source, and a radiation exit face. Especially, in embodiments the radiation input face and the radiation exit face are not the same part of the light transmissive body, though it is not excluded that the same face may be used for providing the radiation input face and the radiation exit face. In specific embodiments, the radiation exit face and the radiation input face are comprises by different faces of the light transmissive body (see further also below).

Hence, the light transmissive body, more especially the radiation input face thereof, is configured downstream of the first light source. Or, in other words, the light transmissive body, more especially the radiation input face thereof, is radiationally coupled with the first light source.

The terms "radiationally coupled" or "optically coupled" may especially mean that (i) a light generating element, such as a light source, and (ii) another item or material, are associated with each other so that at least part of the radiation emitted by the light transmissive body is received by the item or material. In other words, the item or material is configured in a light-receiving relationship with the light transmissive body. At least part of the radiation of light transmissive body will be received by the item or material. This may in embodiments be directly, such as the item or material in physical contact with the (light emitting surface of the) light transmissive body. This may in embodiments be via a medium, like air, a gas, or a liquid or solid light guiding material. In embodiments, also one or more optics, like a lens, a reflector, an optical filter, may be configured in the optical path between light transmissive body and item or material.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

Hence, the light transmissive body is especially transmissive for at least part of the light source light propagating from the radiation input face to the radiation exit face. Further, the light transmissive body is especially further configured to convert part of the light source light propagating through the light transmissive body into first luminescent material light. Light transmissive body are known in the art, such as e.g. described in WO2006/054203, which is incorporated herein by reference.

As indicated above, the light transmissive body is especially configured to convert part of the light source light propagating through the light transmissive body into first luminescent material light having a first luminescent material light spectral power distribution differing from the first spectral power distribution of the first light source light. The first luminescent material light may especially be due to down conversion, see also above.

In a specific embodiment, the light transmissive body may especially have an aspect ratio larger than 1, i.e. the length is larger than the width. In general, the light transmissive body is a rod, or bar (beam), or a rectangular plate, though the light transmissive body does not necessarily have a square, rectangular or round cross-section. In general, the light source is configured to irradiate one (or more) of the longer faces (side edge), herein indicated as radiation input face, and radiation escapes from a face at a front (front edge), herein indicated as radiation exit window. The light source(s) may provide radiation to one or more side faces, and optionally an end face. Hence, there may be more than one radiation input face. The generally rod shaped or bar shaped light transmissive body can have any cross-sectional shape, but in embodiments has a cross section the shape of a square, rectangle, round, oval, triangle, pentagon, or hexagon. Generally, the ceramic or crystal bodies are cuboid. In specific embodiments, the body may be provided with a different shape than a cuboid, with the light input surface having somewhat the shape of a trapezoid. By doing so, the light flux may be even enhanced, which may be advantageous for some applications. Hence, in some instances (see also above) the term "width" may also refer to diameter, such as in the case of a light transmissive body having a round cross section.

Especially for laser purposes, the luminescent body may have a length that is larger than a height and/or width.

In embodiments, the luminescent body is a single crystal.

The above about the luminescent body is described in relation to the first luminescent material, but may also apply for embodiments of the second luminescent material.

For laser applications, the luminescent body comprising the (first) luminescent material may be configured between two mirrors. One of the mirrors (first mirror) may be configured upstream of the luminescent body and downstream of the first light sources, and may be at least in one direction transmissive for first laser light source light and essentially reflective for (first) luminescent material light propagating in an opposite direction. The other of the mirrors (second mirror) may be configured at another end of the luminescent body, and may be considered to be configured downstream of the luminescent body. This mirror may be partly reflective and partly transmissive for the (first) luminescent material light, such that lasing behavior may be promoted and a laser beam of first luminescent light may escape from this mirror. In embodiments, the second mirror may also be reflective for the first laser light. In embodiments, one or more of the mirrors may e.g. comprise a dichroic mirror.

Hence, especially these mirrors may be wavelength dependent. The first mirror upstream may be configured to transmit the pump light but essentially reflect higher wavelengths, especially essentially all converted light. The second mirror downstream of the luminescent body may be configured to transmit part of the converted light. In embodiments, the part of the converted light that is transmitted by the mirror may be in the range of e.g. 40-80% of the converted light. Especially, in embodiments the wavelength dependent mirrors defining the cavity may have a reflection-transmission characteristics allowing to end up with the generate first luminescent material laser light.

Herein, when an element is indicated to be transmissive this may in embodiments imply that at one or more wavelengths the part that is transmitted may be larger than the part that is reflected or absorbed. Herein, when an element is indicated to be reflective this may in embodiments imply that at one or more wavelengths the part that is reflected may be larger than the part that is transmitted or absorbed.

The above in relation to the first luminescent material (body) and its laser function may in embodiments also apply to the second luminescent material.

Especially, also the optional second luminescent material is provided as luminescent body, such as a ceramic body or single crystal.

The term "first light source light spectral power distribution" and similar terms, refer to the spectral power distribution of the first light source light. The term "second light source light spectral power distribution" and similar terms, refer to the spectral power distribution of the second light source light. The term "first luminescent material light spectral power distribution" and similar terms, refer to the spectral power distribution of the first luminescent material light. The term "second luminescent material light spectral power distribution" (see also below) and similar terms, refer to the spectral power distribution of the second luminescent material light. The term "first light source light", and similar terms, refer to the light of the first light source. The term "second light source light", and similar terms, refer to the light of the second light source. Herein, the term "spectral power distribution especially refers to the spectral power distribution in the visible wavelength range.

When there are a plurality of first light sources, they may especially all have essentially the same dominant wavelength. For instance, assuming solid state light sources, they may in embodiments be of the same bin. Assuming the first light sources to emit the first light source light in the visible, the first light source light of the first light sources may essentially be the same. Hence, they may essentially have the same color point and are thus essentially not different.

Likewise, when there are a plurality of second light sources, they may especially all have essentially the same dominant wavelength. For instance, assuming solid state light sources, they may in embodiments be of the same bin. Assuming the second light sources to emit the second light source light in the visible, the second light source light of the second light sources may essentially be the same. Hence, they may essentially have the same color point and are thus essentially not different.

The first light source light and second light source light have different spectral power distributions. Hence, they may have different color points and different dominant wavelengths. Reason to use a first light source and a second light source may be that the first light source may have a wavelength that is very suitable to pump the first luminescent material, but not a spectral power distribution that is useful as color component of the device light and/or not a spectral power distribution useful for pumping the optional second luminescent material.

In specific embodiments, colors or color points of a first type of light and a second type of light may be different when the respective color points of the first type of light and the second type of light differ with at least 0.01 for u' and/or with least 0.01 for v', even more especially at least 0.02 for u' and/or with least 0.02 for v'. In yet more specific embodiments, the respective color points of first type of light and the second type of light may differ with at least 0.03 for u' and/or with least 0.03 for v'. Here, u' and v' are color coordinate of the light in the CIE 1976 UCS (uniform chromaticity scale) diagram.

As further indicated above, the light generating device may especially be configured to generate device light (in one or more operational modes). In one or more operational modes of the light generating device the light generating device is configured to generate white device light comprising the first light source light, the optically filtered first luminescent material light, and the second light source light.

The phrase "the light generating device is configured to generate device light in one or more operational modes", and similar phrases, is essentially equivalent to the phrase "in one or more operational mode the light generating device is configured to generate device light", and similar phrases.

The system, or apparatus, or device may execute an action in a "mode" or "operation mode" or "mode of operation" or "operational mode". Likewise, in a method an action or stage, or step may be executed in a "mode" or "operation mode" or "mode of operation". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability). Hence, in embodiments, the control system may control in dependence of one or more of an input signal of a user interface, a sensor signal (of a sensor), and a timer. The term "timer" may refer to a clock and/or a predetermined time scheme. See further also below.

Especially, there may be a plurality of modes of operation, such as at least two, like at least three, such as at least five, like at least 8, such as at least 16. A change between the modes of operation may be stepwise or stepless. Control can be analogical or digital.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. . . . . Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. . . . . The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, ZigBee, BLE or WiMAX, or another wireless technology.

One or more heat sinks may be configured in thermal contact with one or more of the first light source, the optional second light source, and the first luminescent material, and the optional second luminescent material.

It may be desirable to (further) shape the device light into a beam of device light. Alternatively or additionally, it may be desirable to (further) homogenize the device light (into homogenized device light). To this end, an optical element may be used. Hence, in embodiments the light generating device may further comprise an optical element configured to beam shape the device light and/or configured to homogenize the device light. Especially, the optical element is configured downstream of the first luminescent material. Further, the optical element is configured downstream from one or more first light sources and downstream of the second light source.

The optical element may especially comprise a collimator used to convert (to "collimate") the light beam into a beam having a desired angular distribution. Further, the optical element especially comprises a light transmissive body comprising the radiation entrance window. Hence, the optical element may be a body of light transmissive material that is configured to collimate the converter radiation from the luminescent body. In specific embodiments, the optical element comprises a compound parabolic like collimator, such as a CPC (compound parabolic concentrator). A massive collimator, such as a massive CPC, may especially be used to collimate the (emission) radiation.

The optical element may have cross section (perpendicular to an optical axis) with a shape that is the same as the cross-section of the luminescent body (perpendicular to the longest body axis (which body axis is especially parallel to a radiation input face). For instance, would the latter have a rectangular cross section, the former may also have such rectangular cross section, though the dimension may be different. Further, the dimension of the optical element may vary over its length (as it may have a beam shaping function).

Further, the shape of the cross-section of the optical element may vary with position along the optical axis. In a specific configuration, the aspect ratio of a rectangular cross-section may change, preferably monotonically, with position along the optical axis. In another preferred configuration, the shape of the cross-section of the optical element may change from round to rectangular, or vice versa, with position along the optical axis.

In embodiments, the light generating device may be configured to generate in one or more operational modes (of the light generating device) the white device light having a CRI of at least 85 and a CCT of at maximum 3500 K, such as at maximum 3200 K, such as a CCT of at maximum 3100 K, like at maximum 3000 K.

As indicated above, the light generating device may further comprise control system configured to control the first light source (light) and the optional second light source (light). In specific embodiments, the control system is configured to control one or more optical properties of the device light, especially in further embodiments in dependence of a user interface, a sensor signal, and a timer. In specific embodiments, the one or more optical properties include the correlated color temperature and the color rendering index. In embodiments, in one or more controlling modes the control system is configured to keep the color rendering index above 85, especially over 87, at a correlated color temperature below 3100 K. In yet further embodiments, in one or more controlling modes the control system is configured to keep the correlated color temperature in the range of 2700-3000 K. In this range, the CRI can be kept high, such as even above 85, or even about 90. In yet further specific embodiments, the CRI is at least 88, while the correlated color temperature is equal to or less than 3000 K.

The luminous efficiency of the device (light) may in embodiments be selected from the range of 200-370 lm/W, like in embodiments about 230-370 lm/W, such as in specific embodiments 290-370 lm/W, such as 300-360 lm/W (lm=lumen).

In embodiments, the light generating device is configured to provide the luminescent light with power emitted from the exit surface of the luminescent converter having a power density of 4 W/mm$^2$, especially a power density at least 7 W/mm$^2$, more especially at least 9 W/mm$^2$, even more especially at least 13 W/mm$^2$.

In yet further specific embodiments, the lighting device may be configured to provide luminescent light in combination with blue and/or red laser light coming out the same surface as the luminescent light providing white light with a brightness of at least 2000 lm/mm$^2$, more especially at least 3000 lm/mm$^2$, even more especially at least 6000 lm/mm$^2$, wherein especially the red laser light may be generated by the luminescent material. Herein, "lm" refers to lumen.

In yet a further aspect, the invention also provides a lamp or a luminaire comprising the light generating device as defined herein.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1A:
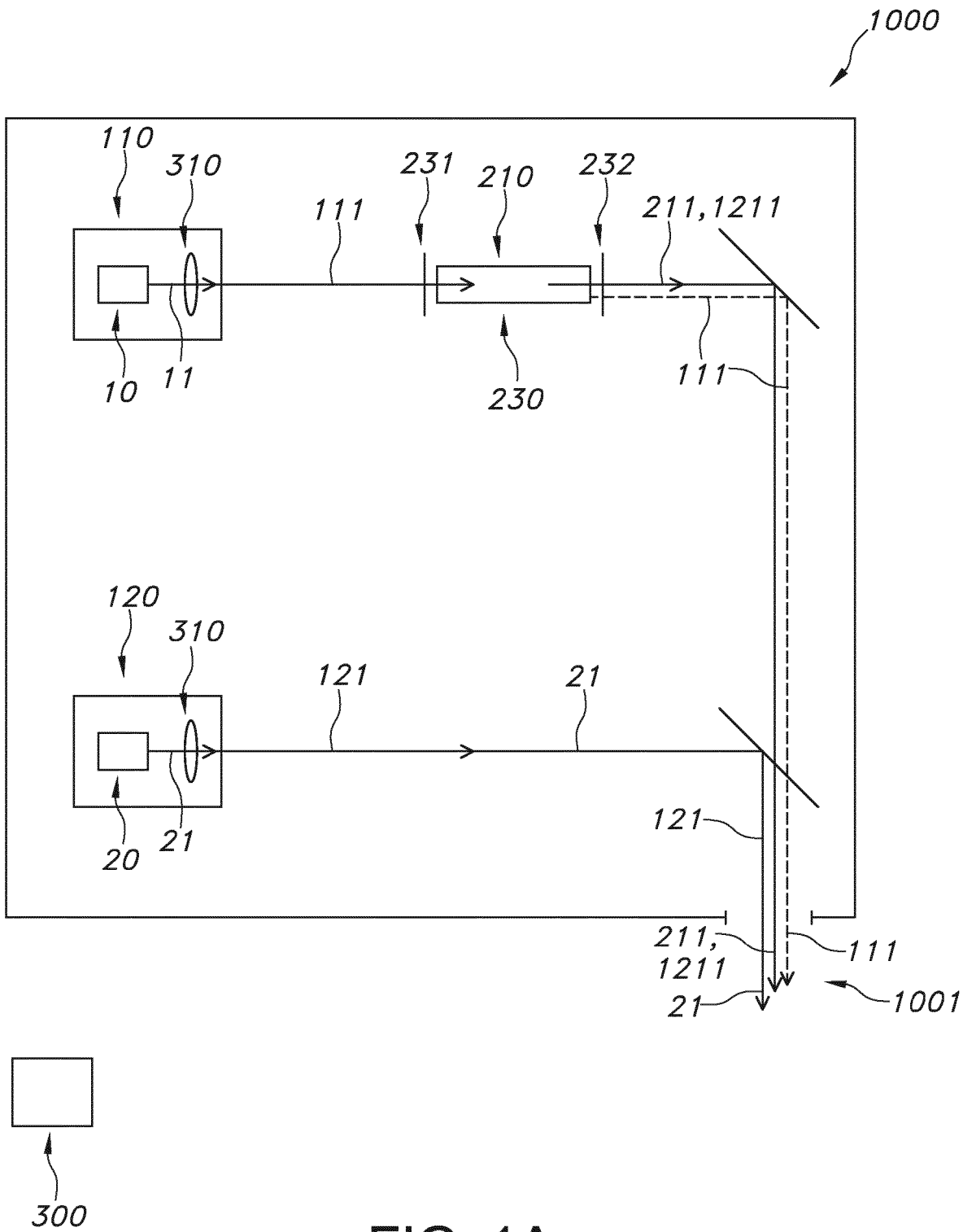
FIGS. 1a-1g schematically depict some possible embodiments.

The schematic drawings are not necessarily to scale.

DETAILED DESCRIPTION OF THE EMBODIMENTS

FIG. 1 schematically depicts an embodiment of a light generating device 1000. The light generating device 1000 comprises a first light source 110 configured to generate first light source light 111. The first light source light 111 has a first light source light spectral power distribution. Especially, the first light source 110 comprises a first laser light source 10 configured to generate first laser light source light 11. Optics 310 may be applied to provide a collimated beam of first laser light source light. The first laser light source 10 is especially a solid state laser, like a diode laser. The light generating device 1000 further comprises a first luminescent material 210 configured to convert at least part of the first light source light 111 into first luminescent material light 211 having a first luminescent material spectral power distribution having an emission at one or more wavelengths selected from the wavelength range of 590-780 nm.

Especially, the first light source 110 and the first luminescent material 210 are configured to generate first luminescent material laser light 1211 having a first luminescent material laser light spectral power distribution comprising at least part of the first luminescent material light 211. To this end, the first luminescent material 210 may especially be provided as ceramic body or comprised by a ceramic bod, or as single crystal or comprised by a single crystal. Further, the luminescent material, especially the luminescent body, may be configured between two optical elements 231,232, especially (wavelength-dependent) mirrors, to provide an optical cavity for the desired laser wavelength(s). Hence, especially the luminescent material 210 may be configured in an optical cavity 230.

The first light source light spectral power distribution and the first luminescent material laser light spectral power distribution mutually differ.

Especially, first luminescent material light 211 or more especially the first luminescent material laser light 1211 may be orange or red, especially red. Hence, the first luminescent material laser light 1211 may have intensity at one or more wavelengths in the orange and/or red, especially at least within the range of 618-650 nm, such as 618-632 nm.

Hence, in embodiments the first light source 110 and the first luminescent material 210, and optional first optics (see below), are configured to generate first luminescent material laser light 1211 having a peak wavelength within the wavelength range of 618-650 nm, more especially a peak wavelength within the wavelength range of 618-632 nm.

Especially, the first luminescent material light may have a dominant wavelength in the 618-650 nm range, especially in the wavelength range of 618-632 nm.

In embodiments, the first luminescent material 210 may comprise an inorganic material doped with a (trivalent) rare earth ion (able to convert one or more of blue light and UV radiation into visible light). For instance, in embodiments the first luminescent material 210 comprises $Pr^{3+}$. Especially, in embodiments the first luminescent material 210 may comprise a $Pr^{3+}$ doped aluminate. For instance with such luminescent material, especially the herein described aluminate, the dominant wavelength may be in the 618-632 nm range, see also FIG. 2.

In specific embodiments, the first light source 110 is configured to generate blue first light source light 111. All this blue first light source light 111 may be converted, or part may be use for generating e.g. white device light 1001. In FIG. 1, the latter variant is schematically depicted.

In one or more operational modes of the light generating device 1000 the light generating device 1000 may be configured to generate white device light 1001 comprising the first luminescent material laser light 1211. To this end, the first luminescent material laser light 1211 and the (remaining) blue first light source light maybe applied. In addition, yellow and/or green light may have to be provided.

FIG. 1a schematically depicts an embodiment wherein e.g. a second light source 120 may be applied. Hence, in embodiments a second light source 120 configured to generate second light source light 121 having a second light source light spectral power distribution may be applied, wherein in embodiments the second light source 120 comprises a second laser light source 20 configured to generate second laser light source light 21. Hence, the second light source light 121 may essentially consist of the second laser light source light 21.

Hence, the light generating device 1000 the light generating device 1000 may especially be configured to generate, in one or more operational modes (of the light generating device 1000), white device light 1001 comprising the first light source light 111, the first luminescent material laser light 1211 and (optionally) the second light source light 121). More especially, in embodiments the device light 1001 may in one or more operational modes the first luminescent material laser light 1211 and the (remaining) blue first light source light 111 and second laser light 21.

Further, the light generating device 1000 further comprises a control system 300 configured to control the plurality of first laser light sources 10 or may be functionally coupled to such control system 300.

Figure 1B:
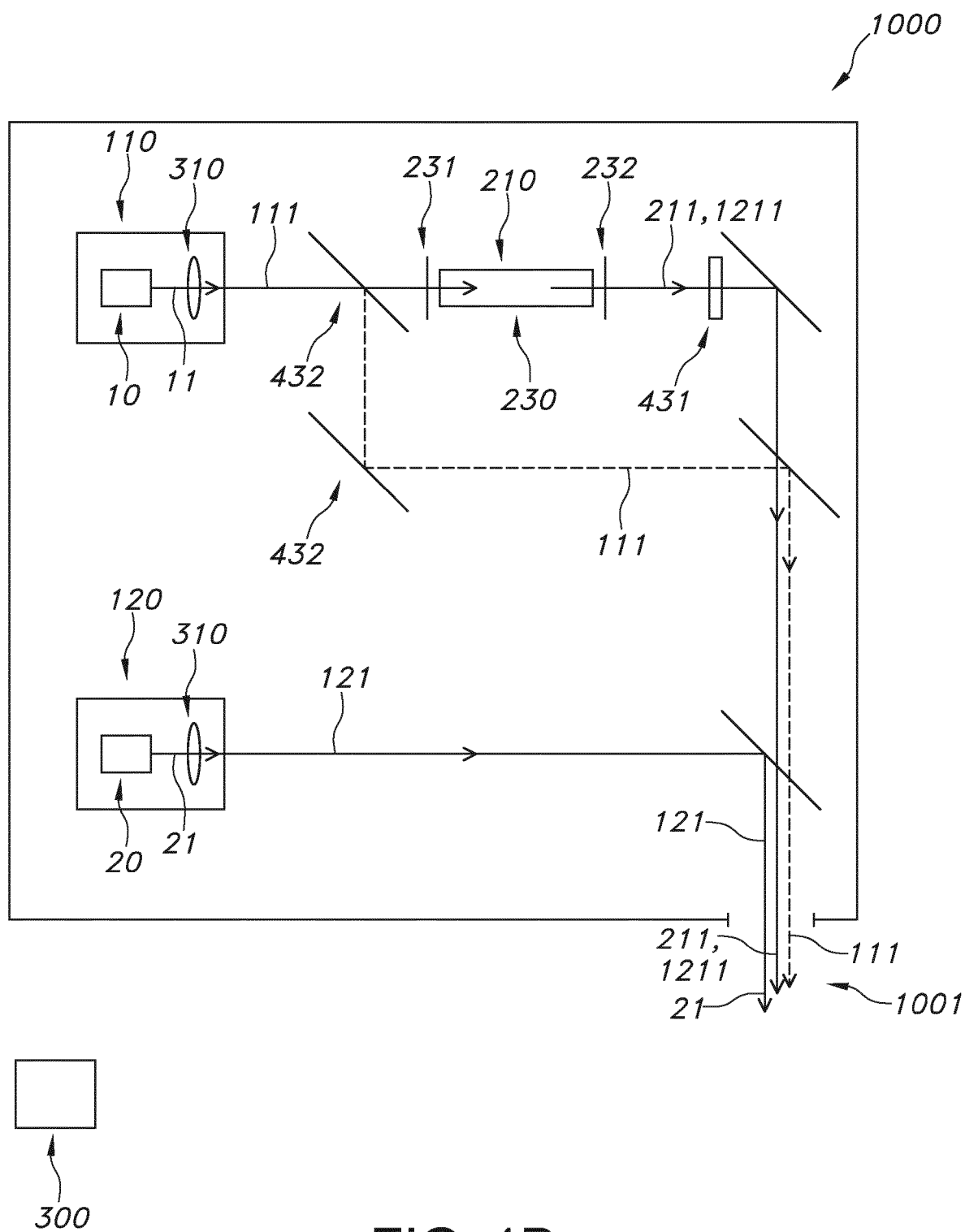

FIG. 1b schematically depicts a variant, wherein the one or more first light sources 110, (the first luminescent material 210,) and (optional) second optics 432 are configured to generate part of the first light source light 111 bypassing the first luminescent material 210. This fist light source light may thus essentially comprise first laser light 11. Optics 432 may be beam splitters or mirrors.

Further, by way of example optional first optics 431 are depicted. Such optional first optics 431 may be used as optical filter to filter out undesired wavelengths. In this way, e.g. a very narrow wavelength region for laser wavelength maybe chosen. For instance, referring to trivalent praseodymium $^3P_0 \rightarrow ^3H_6$ transition may be selected.

Hence, in embodiments in one or more operational modes of the light generating device 1000 the light generating device 1000 is configured to generate white device light 1001 comprising the first light source light 111 that bypasses the first luminescent material 210, the first luminescent material laser light 1211 and (optionally) the second light source light 121.

Figure 1C:
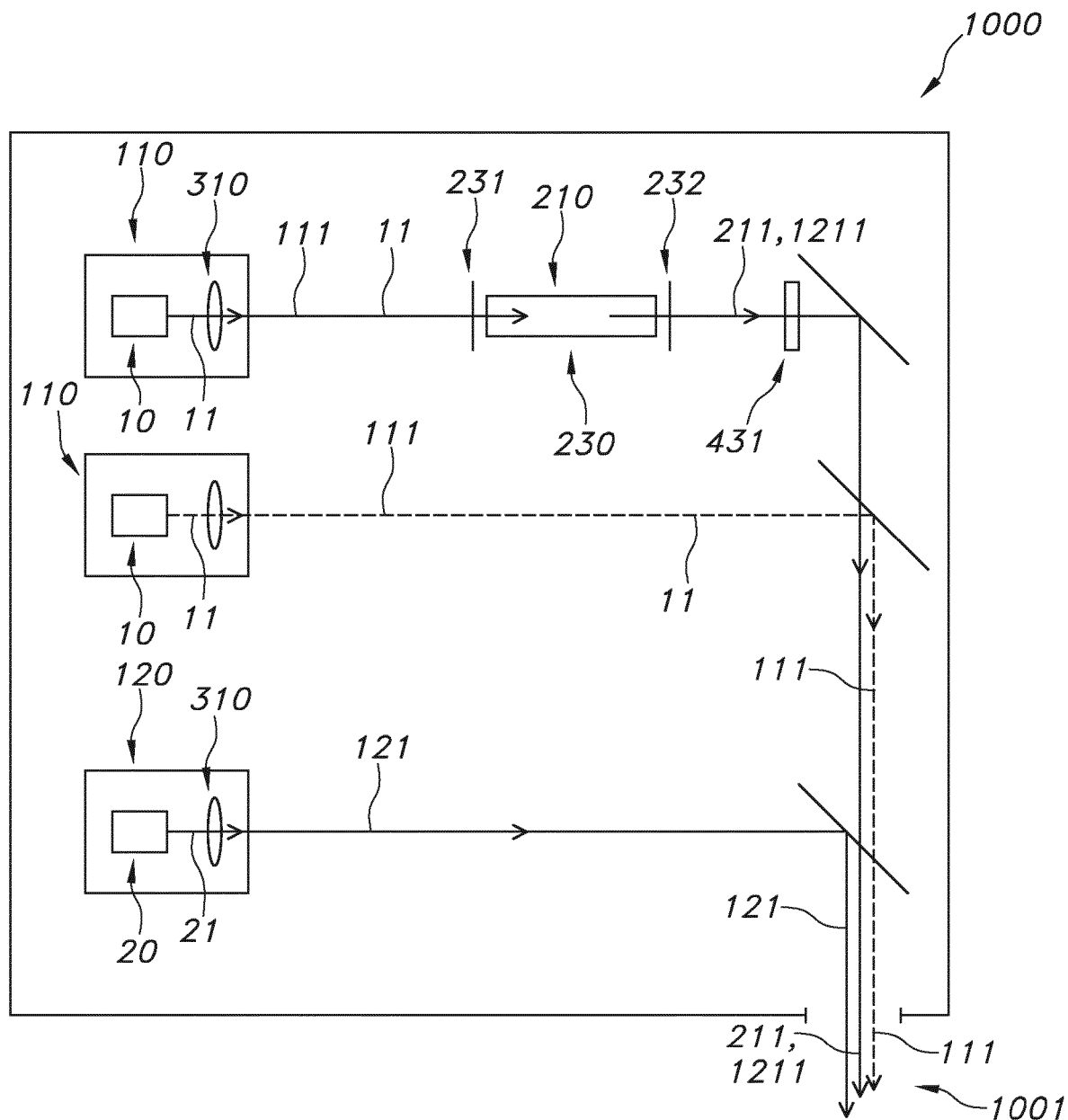

FIG. 1c schematically depicts an embodiment similar to the embodiment of FIG. 1a, however, here, the light generating device 1000 comprises a plurality of first light sources 110 configured to generate the first light source light 111. Part of the first light source light can be mixed into the device light 1001 without being into contact with the first luminescent material 210.

Figure 1D:
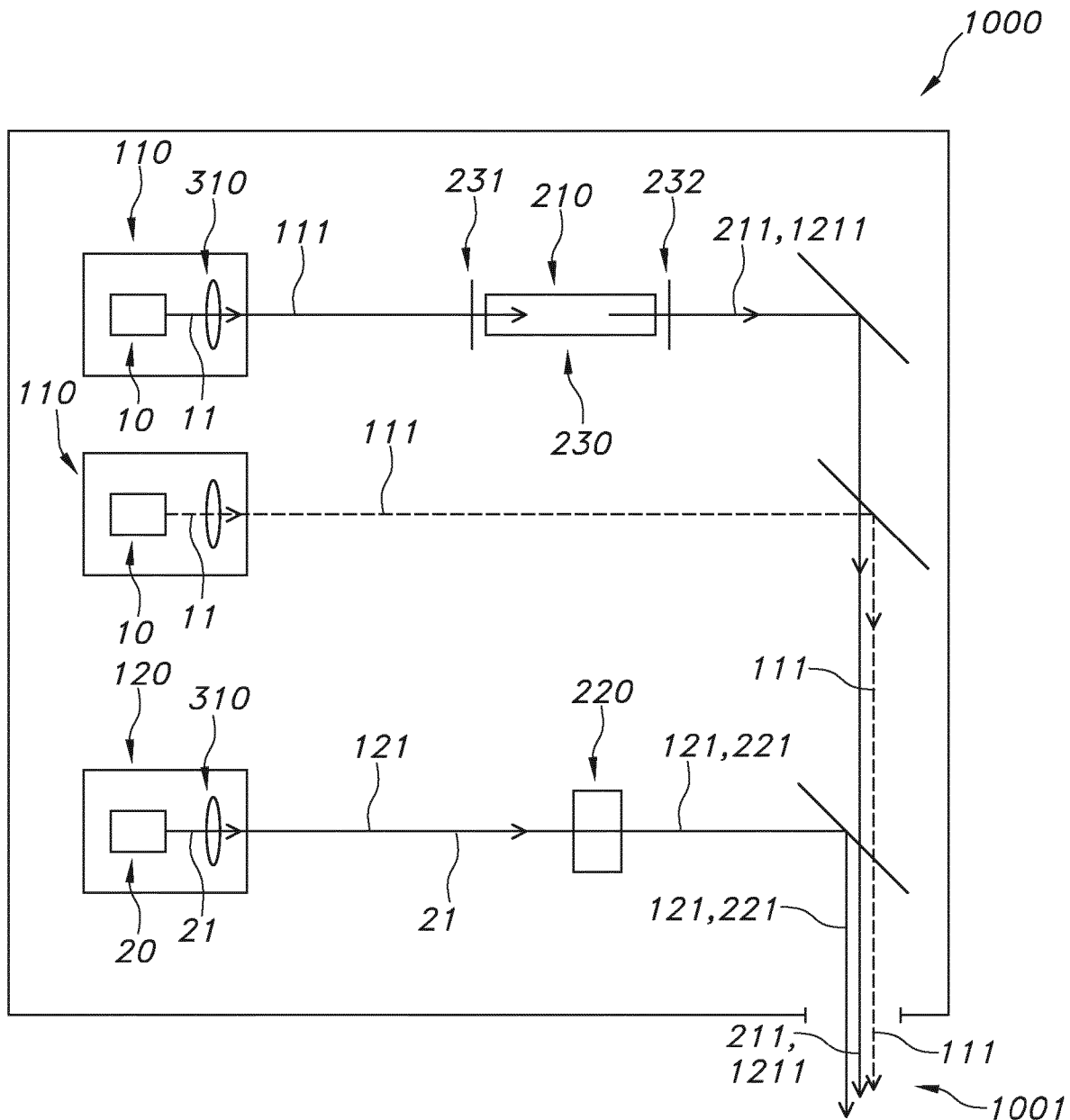
Figure 1D:
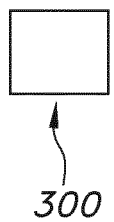
Figure 1E:
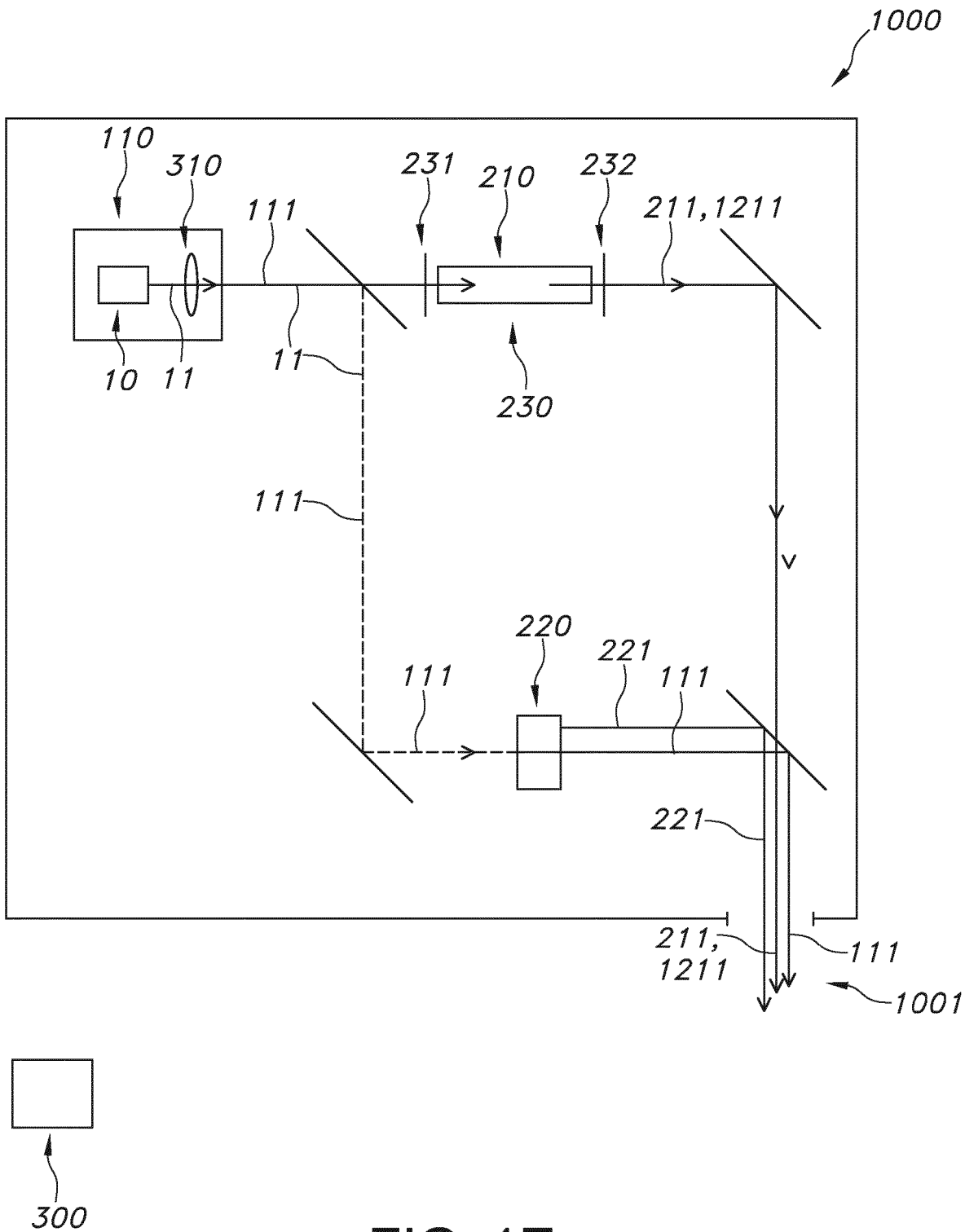

FIGS. 1d and 1e schematically depict embodiments wherein the light generating device 1000 further comprises a second luminescent material 220. The second luminescent material 220 is configured to convert at least part of one or more of (a) the first laser light source light 11 and (b) the optional second light source light, such as in embodiments second laser light source light 21, to provide second luminescent material light 221. In one or more operational modes of the light generating device 1000 the light generating device 1000 is configured to generate white device light 1001 comprising the first luminescent material light 211 and the second luminescent material light 221. Or, in other words (see also above), the light generating device 1000 is configured to generate white device light 1001 comprising the first luminescent material light 211 and the second luminescent material light 221 in one or more operational modes of the light generating device 1000.

FIG. 1d shows an embodiment wherein the second luminescent material 220 is configured to convert at least part of the second light source light, especially second laser light source light 21, to provide second luminescent material light 221. Optionally, part of the second light source light 121 may stay unconverted. Hence, in one or more operational modes of the light generating device 1000 the light generating device 1000 is configured to generate white device light 1001 comprising the first light source light 111 that bypasses the first luminescent material 210, the first luminescent material laser light 1211, and the second light source light 121, and second luminescent material light 221.

FIG. 1e shows an embodiment wherein the second luminescent material 220 is configured to convert at least part of the first light source light 111, especially first laser light source light 11, to provide the second luminescent material light 221. Hence, in one or more operational modes of the light generating device 1000 the light generating device 1000 is configured to generate white device light 1001 comprising the first light source light 111 that bypasses the first luminescent material 210, the first luminescent material laser light 1211, and second luminescent material light 221.

As indicated above, the luminescent material 220 may comprise $(y_{x1-x2-x3}A_{x2}Ce_{x3})_3(Al_{y1-y2}B_{y2})_5O_{12}$, wherein x1+x2+x3=1, wherein x3>0, wherein 0<x2+x3≤0.2, wherein y1+y2=1, wherein 0≤y2≤0.2, wherein A comprises one or more elements selected from the group consisting of lanthanides and scandium, and wherein B comprises one or more elements selected from the group consisting of Ga and In, wherein at maximum 10% of Al—O may be replaced by Si—N. Especially, x3 is selected from the range of 0.001-0.1, wherein 0<x2+x3≤0.1, and wherein 0≤y2≤0.1.

Figure 1F:
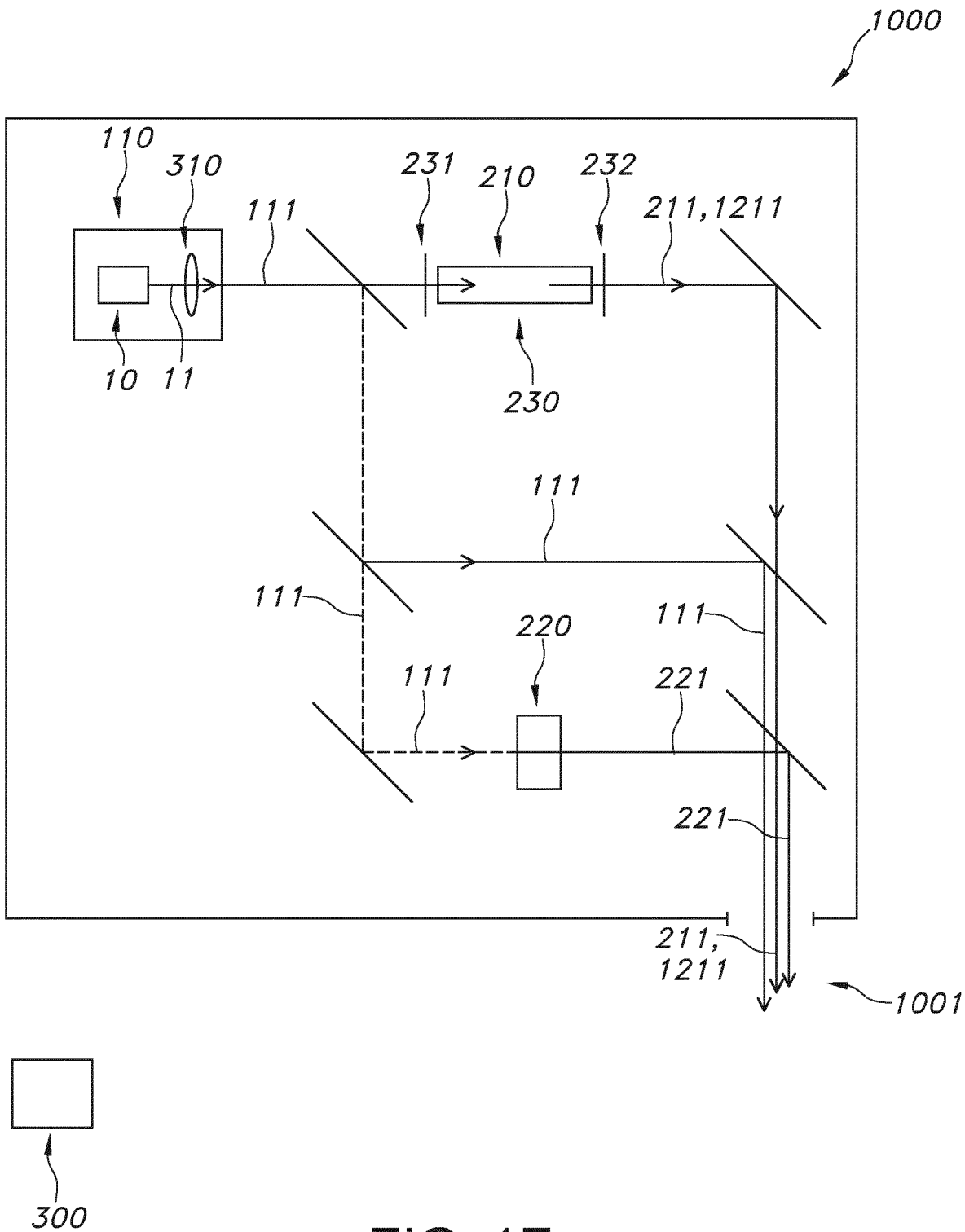

FIG. 1f schematically depicts an embodiment wherein essentially a single type of first light source 110 may be applied. Here, the first laser light source 10 and the first luminescent material 210 are configured to generate first luminescent material laser light 1211. Further, the first laser light source 10 and the second luminescent material 220 are configured to generate second luminescent material light 121. Hence, in one or more operational modes of the light generating device 1000 the light generating device 1000 is configured to generate white device light 1001 comprising the first laser light source light 11, the first luminescent material laser light 1211, and the second luminescent material light 221.

Figure 1G:
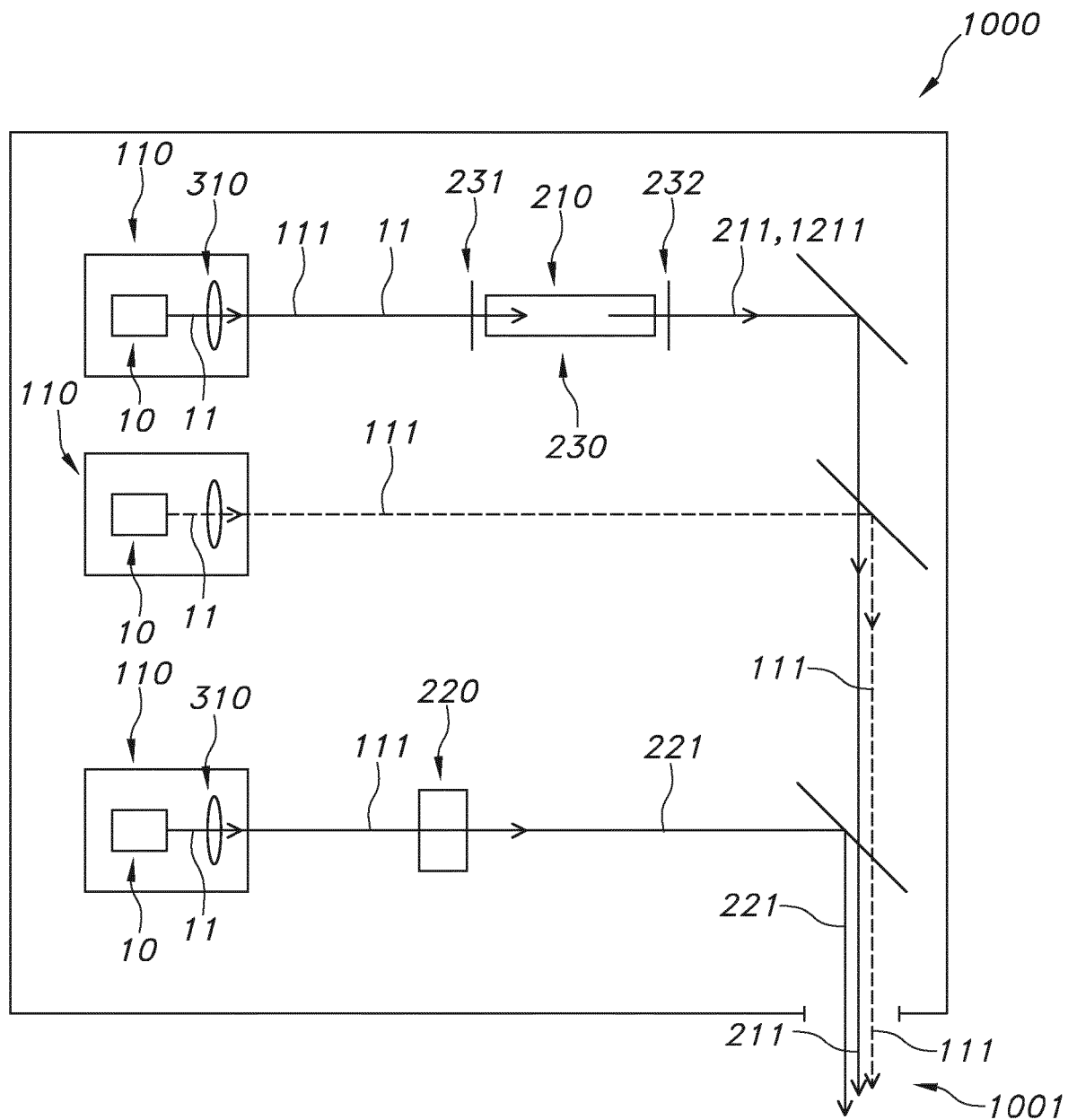

FIG. 1g schematically depicts an embodiment wherein the light generating system 1000 comprises a first set of one of more first laser light sources 10 are configured to generate blue first laser light 11 that bypasses the first luminescent material 210 and the second luminescent material 220. Further, the light generating system 1000 comprises a second set of one of more first laser light sources 10 are configured to generate blue first laser light 11 that irradiates the first luminescent material 210 but bypasses the second luminescent material 220. Yet further, the light generating system 1000 comprises a third set of one of more first laser light sources 10 are configured to generate blue first laser light 11 that bypasses the first luminescent material 210 but irradiates the second luminescent material 220.

In specific embodiments the plurality of first laser light sources 10 are configured to generate blue laser light 11.

In specific embodiments, the control system 300 is configured to control the plurality of first laser light sources 10 (individually).

Referring e.g. to the embodiments such as schematically depicted in FIGS. 1a, 1b, 1c, and 1d, the second light source 120 may be configured to generate second light source light 121 having a second light source light spectral power distribution, wherein the second light source 120 comprises a second laser light source 20 configured to generate second laser light source light 21. Further, the first light source light spectral power distribution, the second light source light spectral power distribution, and the first luminescent material laser light spectral power distribution mutually differ. Yet further, the second light source 120 is configured to generate second light source light 121 having the second light source light spectral power distribution with one or more wavelengths in the green and yellow wavelength range; and Referring to the embodiments schematically depicted in the afore described drawings, in one or more operational modes of the light generating device 1000 the light generating device 1000 is configured to generate the white device light 1001 having a CRI of at least 85 and a CCT of at maximum 3200 K. The optical properties of the device may be controlled by the control system 300. In other operational modes, colored light may be provided, or light with a higher CCT, etc.

The solid state light sources may be controlled by controlling the power and/or by controlling a pulse width modulation of the power.

Figure 2:
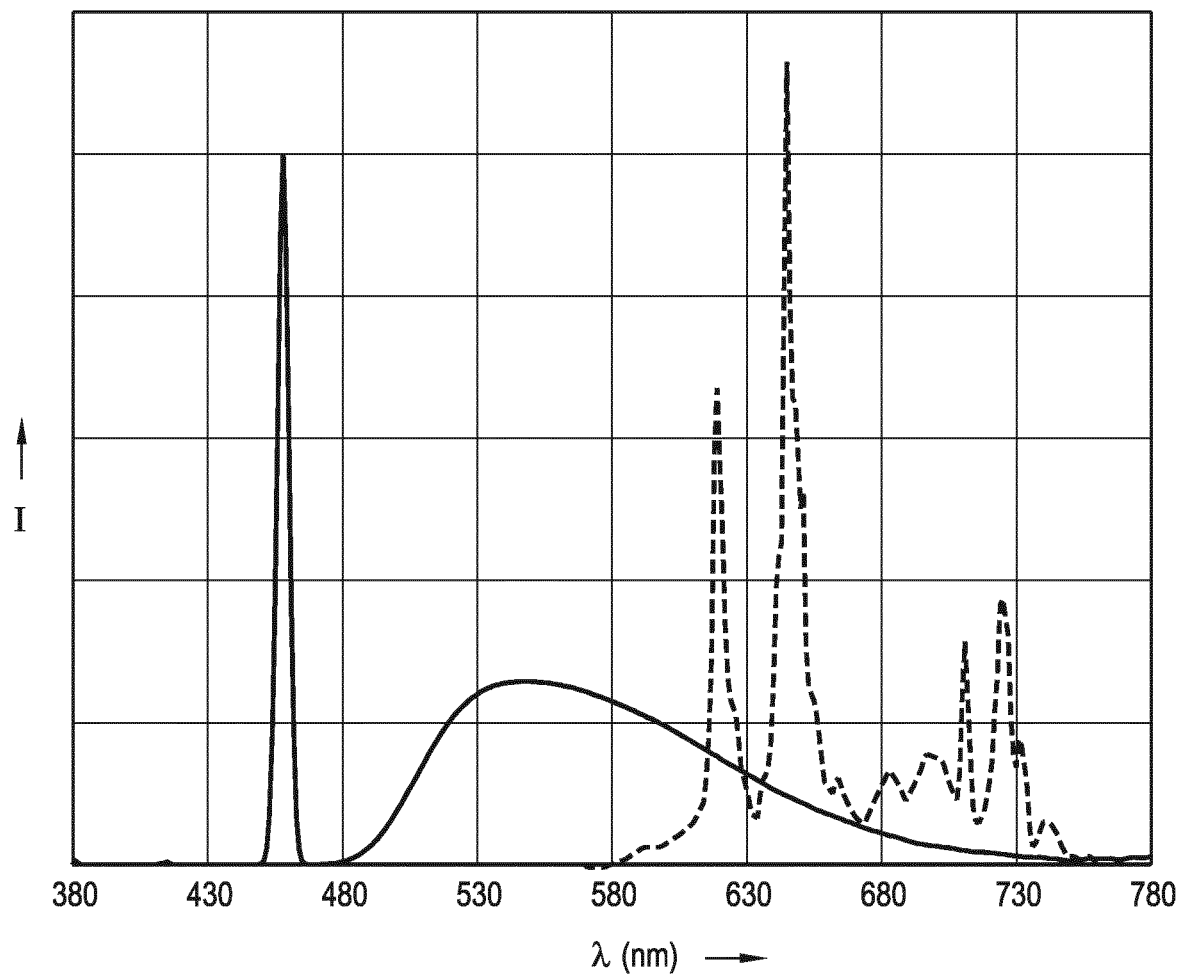
FIG. 2 shows a possible emission spectrum of a light generating device.

FIG. 2 shows a spectral power distribution of an example of device light comprising a blue laser peak, red laser peaks from $Pr^{3+}$, and yellow/green from a garnet luminescent material.

In below table, some examples are given of combinations of blue, green and red. In examples 1-3, the emission spectra of $Pr^{3+}$ in the 580-780 nm range have been chosen of $Sr_{0.7}La_{0.3}Mg_{0.3}Al_{11.7}O_{19}:Pr^{3+}$ (ASL:Pr) by way of example; though other materials may of course also be possible. In Examples, 4-8, the laser line (LL) has been narrowed to a very specific wavelength. The percentage are the radiometric contributions to the white spectrum (based on Watts).

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| CCT (K) | 3,500 | 3,000 | 2,700 | 3,500 | 3,000 | 2,700 | 3,500 | 3,000 |
| CRI | 91 | 92 | 90 | 93 | 92 | 91 | 91 | 90 |
| R9 | 92 | 74 | 64 | 75 | 65 | 76 | 60 | 55 |
| LE (L/W) | 277 | 265 | 257 | 349 | 350 | 348 | 334 | 327 |
| Blue $\lambda_{max}$ (nm), | 470 nm, | 465 nm, | 470 nm, | 465 nm, | 470 nm, | 470 nm, | 465 nm, | 470 nm, |
| DWL (nm), | 470 nm, | 465 nm, | 470 nm, | 465 nm, | 470 nm, | 470 nm, | 465 nm, | 470 nm, |
| percentage | 16% | 9% | 8% | 16% | 15% | 11% | 15% | 14% |
| Green $\lambda_{max}$ (nm), | 547 nm, | 551 nm, | 547 nm, | 543 nm, | 547 nm, | 551 nm, | 543 nm, | 547 nm, |
| DWL (nm), | 571 nm, | 570 nm, | 571 nm, | 568 nm, | 571 nm, | 570 nm, | 568 nm, | 571 nm, |
| percentage | 54% | 51% | 46% | 66% | 65% | 51% | 64% | 63% |
| Red $\lambda_{max}$ (nm), | 645 nm, | 645 nm, | 645 nm, | 620 nm, | 620 nm, | 620 nm, | 628 nm, | 630 nm, |
| DWL (nm), | 624 nm, | 624 nm, | 624 nm, | 620 nm, | 620 nm, | 620 nm, | 628 nm, | 630 nm, |
| percentage | 30% | 40% | 46% | 18% | 20% | 20% | 21% | 23% |
| Red | ASL:Pr (580-780 nm) | ASL:Pr (580-780 nm) | ASL:Pr (580-780 nm) | LL 620 nm | LL 620 nm | LL 620 nm | LL 628 nm | LL 630 nm |
| Percentage blue relative to B + R | 35% | 18% | 15% | 47% | 43% | 35% | 42% | 37% |

The percentage blue indicates the blue contribution to the white light and the percentage blue relative to B+R indicates the percentage of blue relative to the contributions of blue and red.

Figure 3:
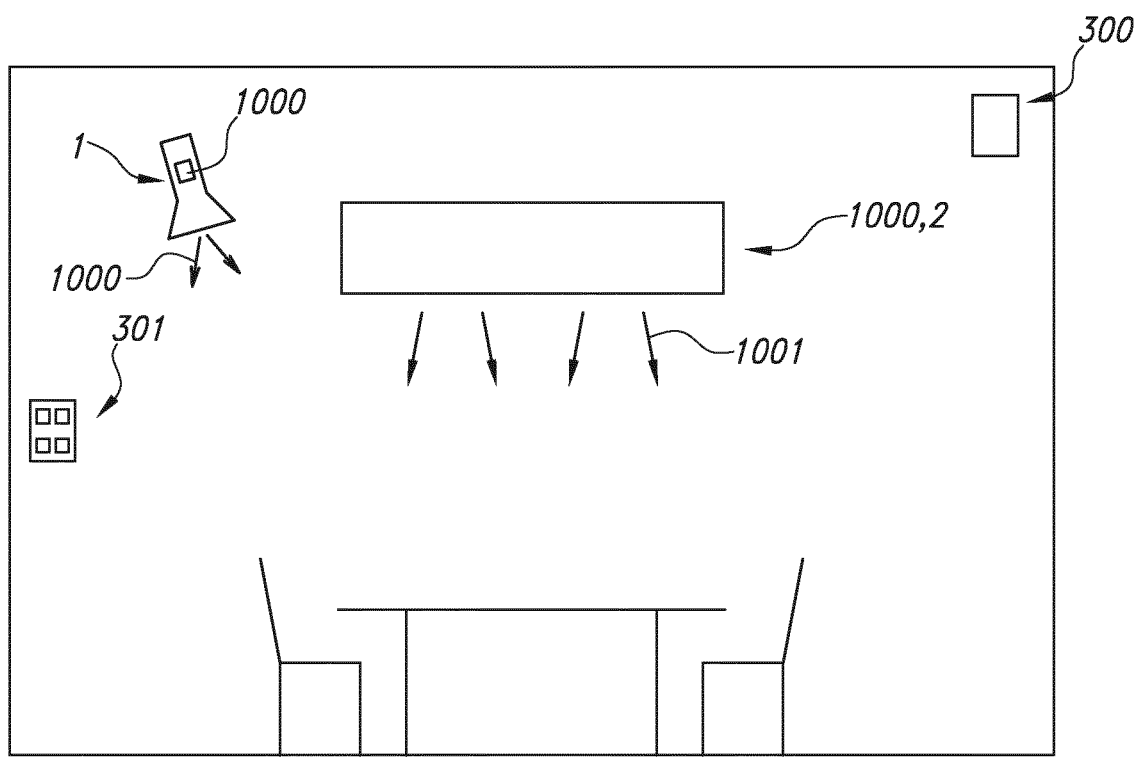
FIG. 3 schematically depicts embodiments of a luminaire and a lamp.

FIG. 3 schematically depicts an embodiment of a luminaire 2 comprising the light generating device 1000 as described above. Reference 301 indicates a user interface, such as a graphical user interface, which may be functionally coupled with the control system 300 comprised by or functionally coupled to the lighting system 1000. FIG. 3 also schematically depicts an embodiment of lamp 1 comprising the light generating device 1000. The lamp 1 or luminaire 2 may also comprise other elements, like optical elements. For instance, the lamp 1 or luminaire 2 may comprise beam shaping optics, or beam direction optics. In embodiments, the lamp 1 or luminaire 2 may comprise beam shaping elements. In embodiments, the luminaire 2 may comprise louvres, etc.

Hence, amongst others, herein the application of rare earth doped crystals which can give down converting laser emission in the red region when stimulated by a blue laser is proposed. Part of the blue laser light is then used to pump a cerium doped YAG phosphor and/or alternative phosphor. Combining spontaneous emission light from YAG, stimulated emission from red emitting crystal, and blue emitting laser may provide white light, which may have a CRI higher than 90 at a CCT of e.g. below 3500 K, such as below 3000K, close or on the BBL. In this way the problem with differential aging can be solved.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device, wherein:
   the light generating device comprises: (a) a first light source configured to generate first light source light having a first light source light spectral power distribution, wherein the first light source comprises a first laser light source configured to generate first laser light source light; (b) a first luminescent material configured to convert at least part of the first light source light into first luminescent material light having a first luminescent material spectral power distribution having an emission at one or more wavelengths selected from the wavelength range of 590-780 nm, wherein the first luminescent material is configured in an optical resonator; (c) a second light source configured to generate second light source light having a second light source light spectral power distribution, wherein the second light source comprises a second laser light source configured to generate second laser light source light; and (d) a second luminescent material configured to convert at least part of one or more of (i) the first laser light source light and (ii) the second laser light source light to provide second luminescent material light;
   the first light source and the first luminescent material are configured to generate first luminescent material laser light having a first luminescent material laser light spectral power distribution comprising at least part of the first luminescent material light;
   the first light source light spectral power distribution and the first luminescent material laser light spectral power distribution mutually differ;
   the light generating device is configured to generate in one or more operational modes white device light comprising the first luminescent material laser light and the second luminescent material light;
   and wherein the second luminescent material comprises $(Y_{x1-x2-x3}A_{x2}Ce_{x3})_3(Al_{y1-y2}B_{y2})_5O_{12}$, wherein $x1+x2+x3=1$, wherein $x3>0$, wherein $0<x2+x3\leq0.2$, wherein y1+y2=1, wherein 0≤y2≤0.2, wherein A comprises one or more elements selected from the group consisting of lanthanides and scandium, and wherein B comprises one or more elements selected from the group consisting of Ga and In, wherein at maximum 10% of Al-O may be replaced by Si-N.

2. The light generating device according to claim 1, wherein the first light source is configured to generate blue first light source light.

3. The light generating device according to claim 2, wherein the first luminescent material is configured to absorb part of the first light source light, and wherein the light generating device is configured to generate in one or more operational modes white device light further comprising the first light source light.

4. The light generating device according to claim 2, comprising one or more first light sources configured to generate the first light source light, wherein:
the one or more first light sources, the first luminescent material and optional second optics are configured to generate part of the first light source light bypassing the first luminescent material; and
the light generating device is configured to generate in one or more operational modes white device light further comprising the first light source light that bypasses the first luminescent material.

5. The light generating device according to claim 1, wherein the second light source is configured to generate blue second light source light.

6. The light generating device according to claim 5, wherein the second luminescent material is configured to convert at least part of the first laser light source light to provide second luminescent material light.

7. The light generating device according to claim 5, wherein:
the first laser light source and the first luminescent material are configured to generate first luminescent material laser light;
the first laser light source and the second luminescent material are configured to generate second luminescent material light; and
the light generating device may be configured to generate in one or more operational modes white device light comprising the first laser light source light, the first luminescent material laser light, and the second luminescent material light.

8. The light generating device according to claim 5, comprising a plurality of first laser light sources configured to generate blue laser light, wherein:
a first set of one of more first laser light sources are configured to generate blue first laser light that bypasses the first luminescent material and the second luminescent material;
a second set of one of more first laser light sources are configured to generate blue first laser light that irradiates the first luminescent material but bypasses the second luminescent material);
a third set of one of more first laser light sources are configured to generate blue first laser light that bypasses the first luminescent material but irradiates the second luminescent material;
the light generating device further comprises a control system configured to control the plurality of first laser light sources.

9. The light generating device according to claim 1, wherein the first luminescent material comprises an inorganic material doped with a rare earth ion, and wherein the optical resonator is defined by two wavelength dependent mirrors.

10. The light generating device according to claim 1, wherein the first luminescent material comprises a $Pr^{3+}$ doped aluminate.

11. The light generating device according to claim 1, wherein the first light source and the first luminescent material and optional first optics, are configured to generate first luminescent material laser light having a peak wavelength within the wavelength range of 618-650 nm.

12. The light generating device according to claim 1, wherein the first light source and the first luminescent material, and optional first optics, are configured to generate first luminescent material laser light having a dominant wavelength within the wavelength range of 618-632 nm.

13. The light generating device according to claim 1,
wherein the first light source light spectral power distribution, the second light source light spectral power distribution, and the first luminescent material laser light spectral power distribution mutually differ;
wherein the second light source is configured to generate second light source light having the second light source light spectral power distribution with one or more wavelengths in the green and yellow wavelength range; and
wherein the light generating device is configured to generate in one or more operational modes white device light further comprising the first light source light and the second light source light.

14. The light generating device according to claim 1, wherein the light generating device is configured to generate in one or more operational modes white device light having a CRI of at least 85 and a CCT of at maximum 3500 K.

15. A lamp or a luminaire comprising the light generating device according to claim 1.

* * * * *